United States Patent

Szczyrbowski et al.

[11] Patent Number: 5,993,622
[45] Date of Patent: *Nov. 30, 1999

[54] APPARATUS FOR COATING A WEB ON A ROTATING DRUM BY PLASMA ASSISTED VAPOR DEPOSITION

[75] Inventors: Joachim Szczyrbowski, Goldbach; Götz Teschner, Hanau; Gerhard Steiniger, Ronneburg, all of Germany

[73] Assignee: Balzers und Leybold Deutschland Holding, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/740,318

[22] Filed: Oct. 28, 1996

[30] Foreign Application Priority Data

Nov. 24, 1995 [DE] Germany .................. 195 43 781

[51] Int. Cl.⁶ .................. C23C 14/34; C23C 16/00
[52] U.S. Cl. .................. 204/298.24; 204/298.07; 204/298.08; 204/298.19; 204/298.26; 204/298.11; 118/718; 118/723 VE; 118/723 MP; 118/726
[58] Field of Search ............. 204/298.07, 298.08, 204/298.19, 298.24, 298.26, 298.11; 118/118, 119, 723 VE, 723 CB, 723 EB, 723 MP, 726

[56] References Cited

U.S. PATENT DOCUMENTS

| | | | |
|---|---|---|---|
| 4,204,942 | 5/1980 | Chahroudi et al. | 204/298.24 |
| 4,692,233 | 9/1987 | Casey | 204/298.24 |
| 4,740,385 | 4/1988 | Feuerstein et al. | 427/535 |
| 4,956,070 | 9/1990 | Nakado et al. | 204/298.18 |
| 5,286,531 | 2/1994 | Krugg et al. | 427/536 |
| 5,302,208 | 4/1994 | Grimm et al. | 118/718 |
| 5,399,252 | 3/1995 | Scherer et al. | 204/298.19 |
| 5,415,757 | 5/1995 | Szczyrbowski et al. | 204/298.08 |

*Primary Examiner*—Nam Nguyen
*Assistant Examiner*—Rodney G. McDonald
*Attorney, Agent, or Firm*—Fulbright & Jaworski, LLP

[57] ABSTRACT

A crucible (4) in a vacuum chamber (3) holds material to be evaporated, such as a metal or metal oxide or a mixture of a metal and a metal oxide, and a coating roll (6) guides a film web (8) a certain distance away from the material to be evaporated. A chamber (9, 10) is provided on each side of the coating roll (6) which carries the film web (8) past the crucible (4), a magnetron cathode (11, 12) connected to a medium-frequency source (19) being provided in each chamber. Each of the two chambers (9, 10) is connected by its own channel (13, 14) to a coating zone (20) directly between the coating roll (6) and the crucible (4), and each chamber (9, 10) is connected by a pressure line (21, 22) to a source (23, 24) of process gas.

8 Claims, 3 Drawing Sheets

APPARATUS FOR COATING A WEB ON A ROTATING DRUM BY PLASMA ASSISTED VAPOR DEPOSITION

BACKGROUND OF THE INVENTION

The invention pertains to a vacuum coating apparatus with a crucible in a vacuum chamber for holding the material to be evaporated, such as a metal or metal oxide or mixture of the two, and with a strip of film guided by rolls a certain distance away from the material to be evaporated.

U.S. Pat. No. 5,302,208 discloses a vacuum coating apparatus with a container for material to be evaporated, with an evaporation device for evaporating the material in the container, the substrate to be coated being a certain distance away from the material to be evaporated. A microwave transmitter transmits microwaves into the space between the material to be evaporated and the substrate to be coated. This known apparatus makes it possible to improve the properties of a metal oxide coating on a plastic film.

U.S. Pat. No. 4,956,070 discloses an apparatus for depositing a thin film by sputtering, in which the rates at which layers of different materials are deposited can be controlled, so that extremely thin layer packages can be produced. For this purpose, at least two different types of counterelectrodes are provided on the cathode side.

DE 35 41 621 discloses an apparatus for depositing a metal alloy by means of HF sputtering, in which two targets are driven in alternation. Both targets contain the metal components of the metal alloy to be deposited but in different proportions. For the purpose of deposition, the substrates are mounted on a substrate carrier, which is rotated by a drive unit during the sputtering process.

DE 38 02 852 discloses an apparatus for coating a substrate, including two electrodes and at least one material to be sputtered, in which the substrate to be coated can be set up between and a certain distance away from the two electrodes, and the alternating current half-waves can be selected as low-frequency half-waves with essentially the same amplitudes.

U.S. Pat. No. 5,415,757 discloses an apparatus for coating a substrate especially with nonconductive layers from electrically conductive targets in a reactive atmosphere. A current source is connected to cathodes which enclose magnets and which are installed in an evacuatable coating chamber, the cathodes working together electrically with the targets. Two anodes separated electrically from each other and from the sputtering chamber are installed in a plane between the cathodes and the substrate. Each of the two outputs of the secondary winding of a transformer connected to a medium-frequency generator is connected to a cathode by way of a power feed line, the first and the second feed lines being connected to each other by a branch line, into which an oscillatory circuit, preferably a coil and a capacitor, are inserted. Each of the two feed lines is connected both to the coating chamber by way of a first electrical element which adjusts the d.c. potential with respect to ground and also to the respective anode by way of a corresponding second electrical element as well as to the coating chamber by way of a branch line containing a capacitor. A choke coil is inserted in the segment of the first feed line which connects the oscillatory circuit to the second secondary winding.

Finally, DE 44 12 906 discloses a method for ion-assisted vacuum coating, preferably for the high-speed coating of large, electrically conductive or electrically insulating substrates with electrically insulating layers and for coating electrically insulating substrates with electrically conductive layers. In this method, a plasma is generated between a coating source and the substrate, and ions from the plasma are accelerated toward the substrate. Voltage pulses alternating between negative and positive relative to the plasma, are applied to the electrically conductive substrate or to an electrode mounted directly behind the electrically insulating substrate and extending over the entire surface to be coated. The duration of the negative pulses is adjusted to the charging time of the capacitor being formed over the insulating layer and/or the insulating substrate, whereas the duration of the positive pulses is at most equal to, preferably 2–10 times smaller than, the duration of the negative pulses. The positive and negative pulses succeed each other without pause and are adjusted approximately to the same amplitude relative to the base potential. The amplitude of the pulses relative to the base potential is adjusted to ±20 to ±2,000 V, preferably to ±50 to ±500 V.

Transparent plastic films are being used to an increasing extent for the packaging of food products. The films primarily in question here are made of polymeric plastics, which, although they are flexible, suffer from the disadvantage that they are permeable to aromatic substances, water, and oxygen. When it is desired to prevent the diffusion of such substances, the general practice is to use aluminum foils or plastic films onto which a layer of aluminum has been deposited from the vapor phase. These have the disadvantage, however, that they are relatively difficult to dispose of and are not transparent to microwaves or light. Because of the widespread use of microwave ovens in many households of industrialized countries, it is often important for a packaging material to be transparent to microwaves.

To combine the advantages of plastic films, which are transparent to microwaves, with the advantages of aluminum foils, which form an impenetrable barrier to aromatic substances, water, and oxygen, it is already known that polymer films can be coated with oxides. Silicon oxide plays the most important role as a coating material for this purpose. The properties of plastic films coated with silicon oxide are similar to those of aluminum foil or aluminum-coated plastic film with respect to the structure of the laminate and the barrier behavior with respect to oxygen, water vapor, and aromas.

The coating of plastic films with metal oxides such as $SiO_x$, however, requires a process technology which differs sharply from the conventional coating technologies, because metal oxides, in contrast to metals, must be evaporated from the solid phase.

$SiO_x$ layers are produced by evaporating SiO by the use of an evaporation furnace or by means of an electron beam (see T. Krug and K. Rübsam: Die neue "gläserne Lebensmittelverpackung" in Neue Verpackung, Hüthig-Verlag, 1991). $SiO_x$ layers offer the advantage that they are more flexible. In addition, $SiO_x$ is also chemically inert and corrosion-resistant with respect to water. Because it has a relatively high vapor pressure, SiO can, like MgO, $Al_2O_3$, and $SiO_2$, be evaporated by means of an electron beam.

SUMMARY OF THE INVENTION

The object of the present invention is to provide a vacuum coating apparatus which makes it possible to coat films, especially packaging films, with transparent barrier layers at a high rate and with high quality. The apparatus is also intended to have a long service life in spite of the parasitic oxide layers being deposited and to make possible a high level of process stability.

According to the invention, a substrate, such as a web of film guided over rolls, is held a certain distance away from the material to be evaporated. On both sides of the coating roll guiding the film web past the crucible, there is a chamber, in each of which a magnetron cathode connected to a medium-frequency current source is provided. Each of the two chambers is connected by way of its own channel to the zone directly between the coating roll and the crucible, a partition wall which separates the coating space from the winding space being provided above these channels, each of the two chambers being connected by way of pressure lines to sources for a process gas.

DETAILED DESCRIPTION OF THE PREFERRED EMBODIMENTS

Figure 1:
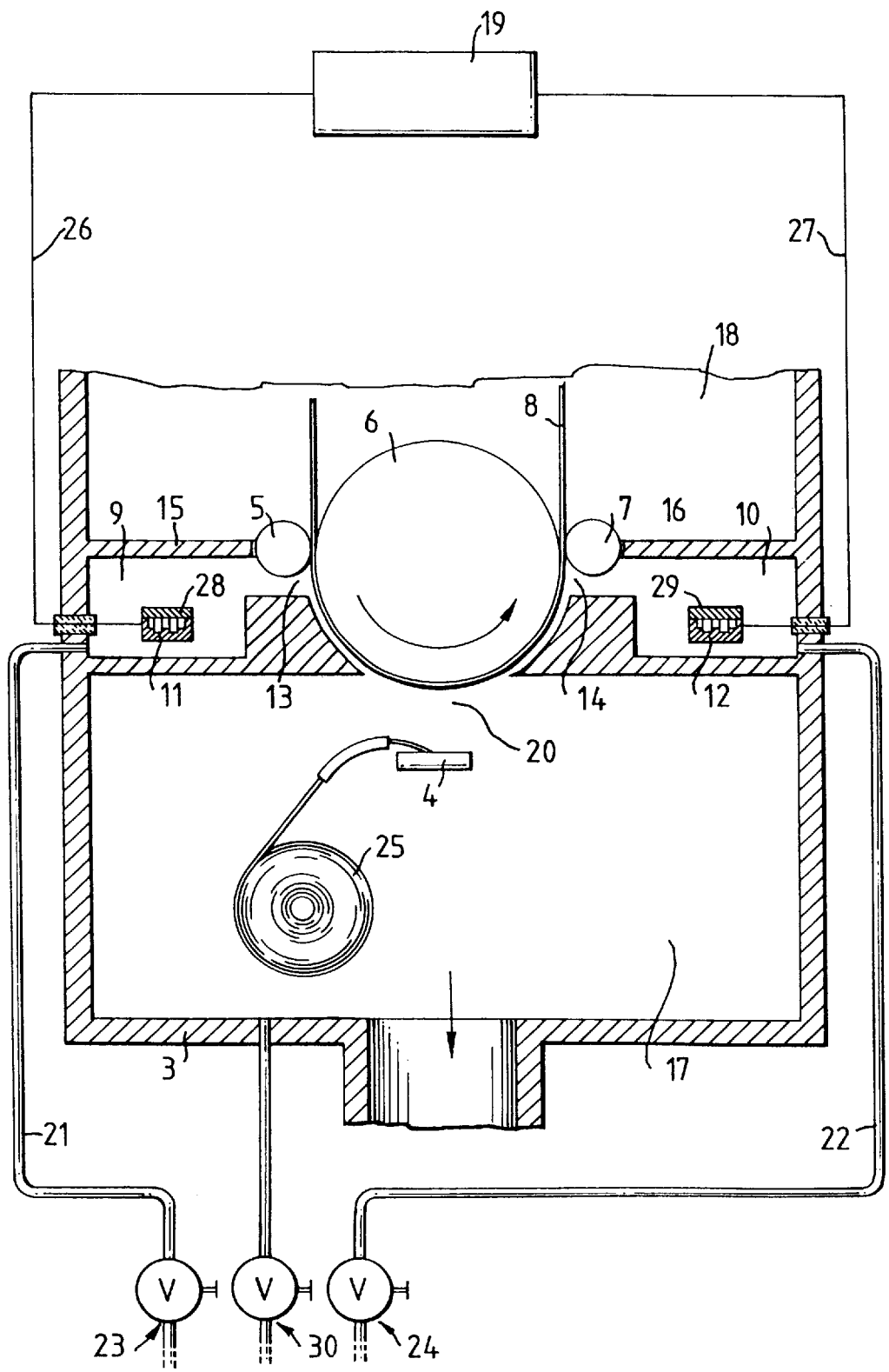
FIG. 1 is a schematic cross section of a first embodiment.

FIG. 1 shows a vacuum chamber 3, in which an elongated crucible 4 is provided. Above this crucible 4 is a coating roll 6, which forms the top boundary of a coating chamber 17. A film 8 to be coated, which is unwound from a supply roll and is wound up again on a take-up roll passes continuously over this coating roll 6.

A resistance heating element is used to heat crucible 4, and the supply of material to be evaporated, in the form of wire, is replenished from a motorized supply roll 25. On both sides of coating roll 6, rolls 5, 7 press film web 8 down on coating roll 6 and ensure at the same time that there is a good seal against partition walls 15, 16, which separate the actual coating space 17 from winding chamber 18. On both sides of coating roll 6, furthermore, chambers 9, 10 are provided, in which sputtering cathodes 11, 12 are installed. Each of the two sputter cathodes 11, 12 is connected by a power feed line 26, 27 to a medium-frequency power supply 19. Chambers 9, 10 are connected by feed lines 21, 22 to process gas sources 23, 24, and are also connected by way of channels 13, 14 to a zone 20 directly below coating roll 6 and above evaporation source or crucible 4.

Sputter cathodes 11, 12 are designed as magnetrons and constructed in such a way that their longest dimension is at least as long as the length of rolls 5, 6, 7, which are designed as cooling rolls, the longitudinal axes of the cathodes being are parallel to the axes of the rolls. Targets 28, 29 of the two cathodes 11, 12 face side walls 15, 16, respectively.

Figure 2:
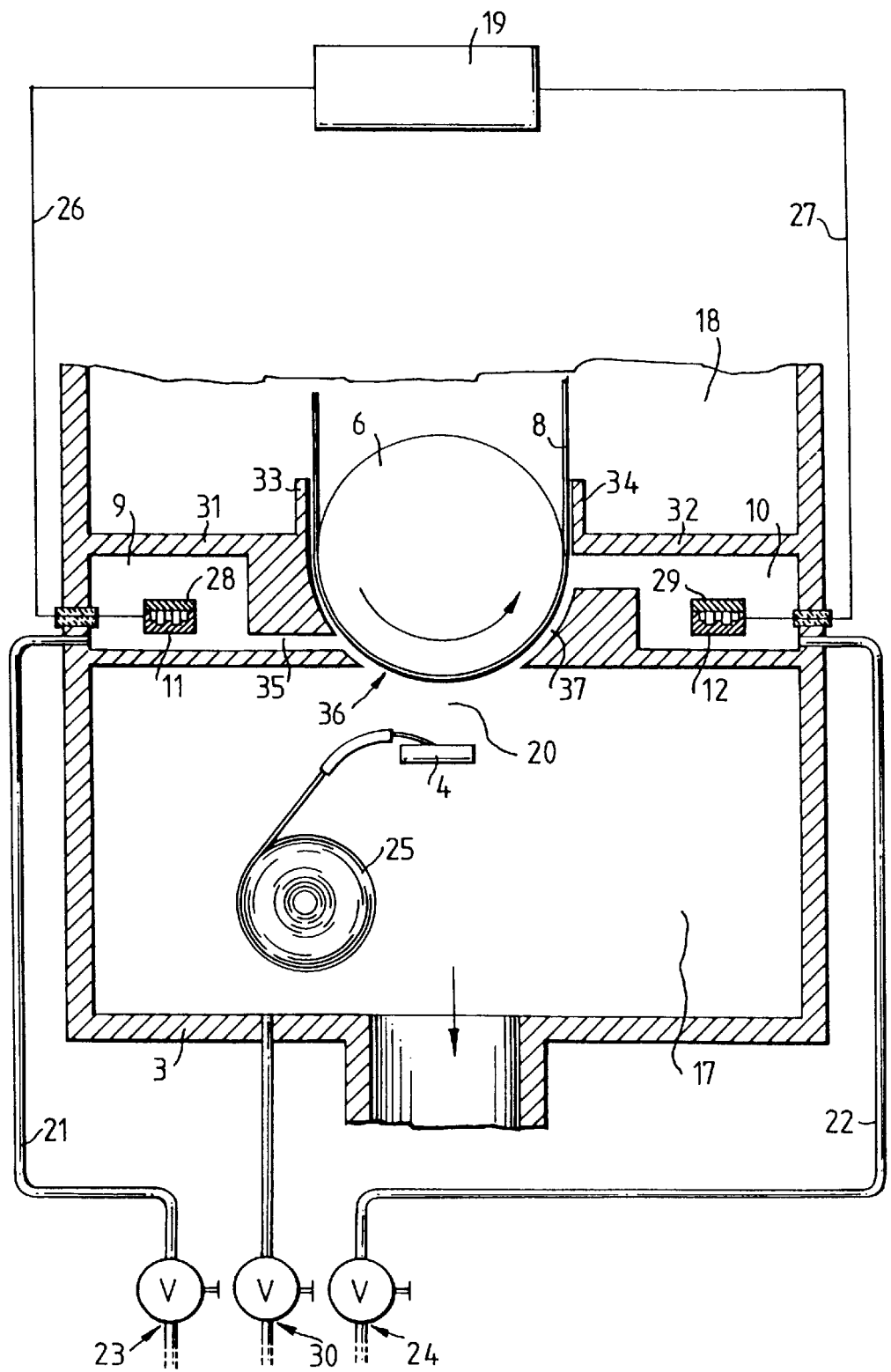
FIG. 2 is a schematic cross section of a second embodiment.

The embodiment according to FIG. 2 differs from that of FIG. 1 in that two rolls do not rest against coating roll 6 and do not seal off coating space 17 from winding chamber 18; instead, partition walls 31, 32 are provided with wire ribs 33, 34, which fit very closely against coating roll 6. In addition, chamber 9 is connected by way of a channel or gap 35 to zone 20; the opening of this channel is very close to the section of coating roll 6 which faces crucible 4 and forms the actual coating window 36. Second chamber 10 for cathode 12 is also connected by a gap or channel 37 to zone 20, but this channel is longer than the one on the other side of coating roll 6.

Figure 3:
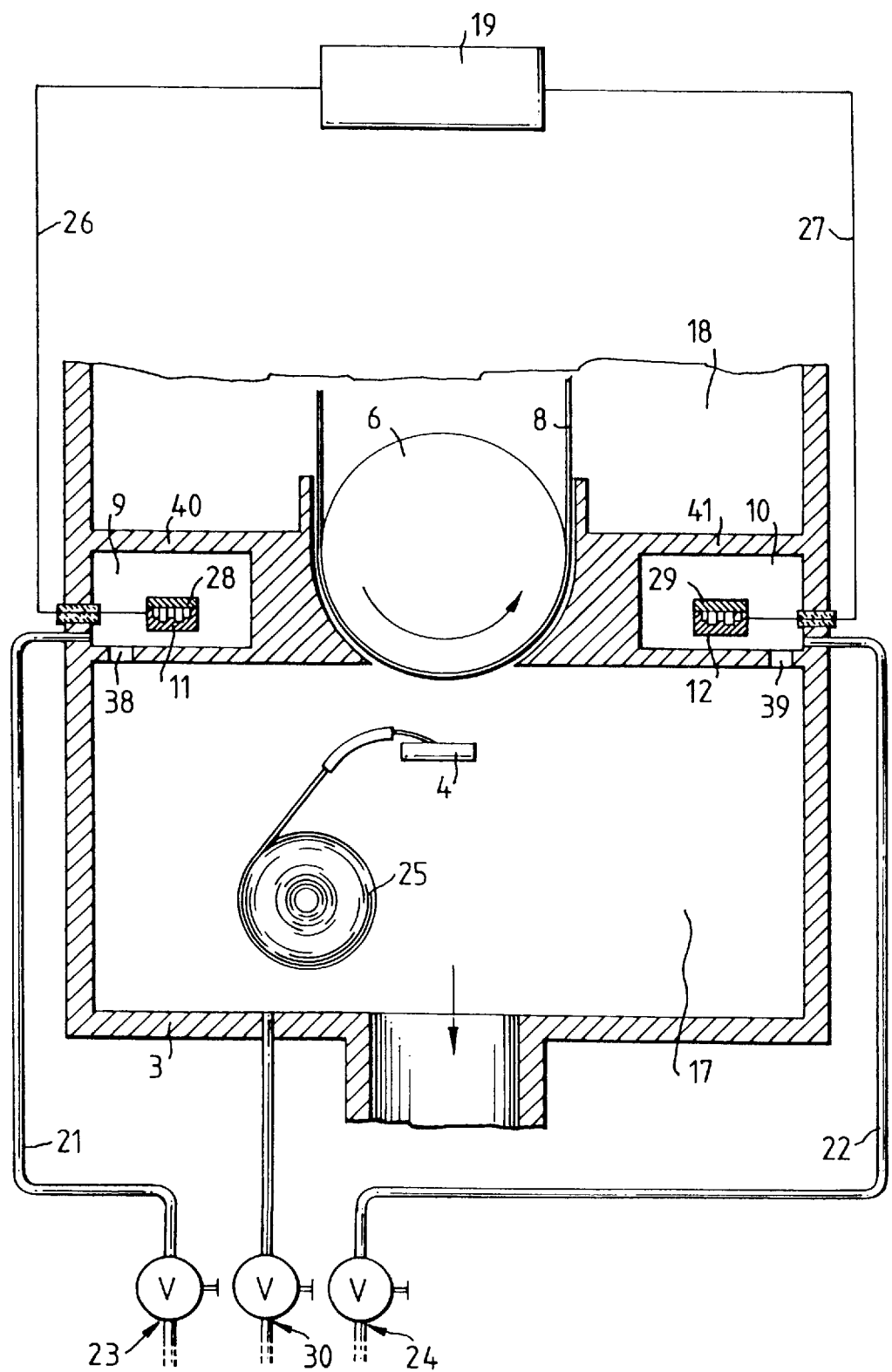
FIG. 3 is a schematic cross section of a third embodiment.

In the exemplary embodiment according to FIG. 3, the two chambers 9, 10 provided at the sides of coating roll 6 are connected directly via openings 38, 39 to the vacuum chamber; coating roll 6 is sealed off from chambers 9, 10 by partition walls 40, 41.

If the gaps or channels 13, 14 are designed as shown in FIG. 1 so that the gaps are between the rolls 5 and 7, the plasma will spread out along film 8 resting on the roll. By arranging the components in a different way, the wrap angle can be increased slightly in comparison to the 180° shown in FIG. 1. Wrap angles of up to 270° are easy to obtain. In FIG. 2, only a short pretreatment is desired. For this reason, channel 35 is reduced in length on the take-off side. FIG. 3 shows that channels 38, 39 can also be located outside cooling roll 6, so that a weak ion treatment is obtained only in the coating zone. The two magnetrons 11, 12 are connected to an a.c. voltage source 19. The alternating voltage can have a frequency of 40 kHz, for example, but the process also works at lowers frequencies.

The two magnetrons 11, 12 carry targets; in the case of FIG. 2, the particles evaporated from them are not supposed to reach film 8. It is also possible, however, for one or both targets 28, 29 to be oriented in the direction of cooling roll 6, so that the magnetrons deposit particles on film 8. This might be the case, for example, when it is desired to give the first layers of the coating the advantage of the fact that a sputtered coating adheres better that a vapor-deposited one.

Separate systems for supplying the reactive gases ($O_2$, $N_2$, organic compounds, etc.) to the individual chambers 9, 10 are shown, so that the possibility is obtained of being able to set the optimum conditions for each process and to supply the different chambers with the same or different gases or gas mixtures.

In comparison with apparatuses without magnetrons supplied with alternating voltage, the apparatus according to the invention offers the advantage of a high plasma density, which allows intense bombardment during the growth of the coating. In comparison with the previous solution according to DE 44 12 906, the advantage is obtained that the two magnetrons 11, 12 are installed in separate compartments of the vacuum chamber and thus cannot be coated by parasitic layers. The design causes a plasma band to form over a large wrap angle of the coating roll. As a result, the plasma contact produced, which is essential to obtaining the desired coating structure, is much longer and more intense than that of the known solution. The length of the zone of influence of the plasma is not predetermined. By means of appropriate design measures, it is possible to determine the length of the zone of influence independently of the coating zone and in this way to provide, for example, either no pretreatment or a only a short pretreatment. Because of their separation, furthermore, it is possible to operate both the evaporator and the magnetrons in the pressure ranges optimum for them, possibly with the use of additional vacuum pumps and under control of the gas inlets for the reactive gases. It is therefore possible to control the production of radicals from the reactive gases independently of the vapor deposition process. When electron evaporation sources are used, the problem is encountered that the nonconductive layer or the film itself becomes highly charged, which leads to problems when the film is being wound up. Because the plasma is quasi-neutral, however, charge carriers from the plasma are drawn onto the film. As a result, the charge level is reduced as the film passes by the magnetron compartment in the direction toward the take-up roll.

We claim:

1. A vacuum coating apparatus for coating a web, said apparatus comprising a vacuum chamber, partition means separating said vacuum chamber into a coating space and a winding space, a source of evaporated material in said coating space, said source comprising a crucible containing material to be evaporated, a coating roll rotatably supported in said partition means, said coating roll and said partition means defining therebetween two passages connecting the winding space and the coating space, said coating roll guiding a web from said winding space through one of the passages and into said coating space, guiding said web in the coating space so that said web is exposed to a coating zone in said coating space between said coating roll and said crucible, and guiding said web through the other of said passages out of said coating space, said passages being configured to surround the coating roll so that the coating space and the winding space are maintained substantially isolated from each other while said web passes through the passages, a pair of coating chambers, each of said coating chambers having an interior space and being located on a respective side of said coating roll between said partition means and said coating space, each of said coating chambers having a channel portion defining a channel space adjacent to the coating roll and communicating with said coating space and the interior of the respective coating chamber, means for supplying process gas to each of said coating chambers, and a pair of magnetron cathodes, each of said magnetron cathodes being located in the interior space of a respective coating chamber, said magnetron cathodes being connected to a power supply having a frequency of 40 kHz or less, and wherein said channel spaces are large enough to permit plasma to flow therethrough between the interiors of the coating chambers and the coating space, said power supply supplying power to said cathodes such that said cathodes form therebetween a plasma flow passing through one of the channel spaces, into the coating zone adjacent the web therein, and through the other of the channel spaces and into the other coating chamber.

2. A vacuum coating apparatus as in claim 1 wherein said magnetron cathodes comprise a target which faces said partition means.

3. A vacuum coating apparatus as in claim 2 wherein said partition means comprises a pair of sealing rolls, said sealing rolls being located on either side of said coating roll and pressing against said web, thereby sealing said channel spaces from said winding space.

4. A vacuum coating apparatus as in claim 1 wherein at least one of said channel spaces is bounded at least partially by said coating roll and the web thereon.

5. A vacuum coating apparatus in claim 1 further comprising means for circulating a coolant through said coating roll.

6. The apparatus of claim 1, and said coating roll having a circumference about which said web extends at least partly, said coating chambers being displaced from each other between about 180 and 270 degrees of said circumference.

7. The apparatus of claim 6, and said coating chambers being displaced from each other about 180 degrees of the circumference of the coating roll.

8. A vacuum coating apparatus for coating a film web, said apparatus comprising:

a vacuum chamber having an interior;

a partition in said vacuum chamber;

a roller rotatably supported in an opening of said partition and supporting said film web, said roller and said partition defining therebetween passages through which the film web can pass as the roller is rotated, said roller and partition dividing said interior into a winding space and a coating space, said passages being defined as small enough to substantially isolate the winding space from the coating space;

first and second coating chambers each having a chamber interior and a wall adjacent said roller and spaced from said partition, said walls defining a flow space adjacent the roller and the film web thereon, which space is connected with the chamber interior;

said vacuum chamber having therein a crucible in the coating space containing material that is evaporated and deposited on the film web, the roller exposing said film web to the material evaporated from the crucible in a crucible region of the coating space between the wall of the first coating chamber and the wall of the second coating chamber, the flow spaces communicate with said region of the coating space;

said roller and said walls of the coating chambers defining the flow spaces to accommodate a plasma flow therethrough adjacent the film web between the chamber interiors into and out of the crucible region of the coating space;

a pair of magnetron cathodes each supported in the interior of a respective coating chamber;

a means for supplying a process gas operatively associated with each of said coating chambers for introducing said process gas to the interior thereof;

AC power supply having a frequency of 40 kHz or less applying power to the magnetron cathodes so that a plasma flow forms therebetween passing through the flow space of the first coating chambers the crucible region and the flow space of the second coating chamber;

said roller having a circumference about which the web extends as it is guided into and out of the coating space, said plasma flow flowing adjacent to and contacting said web over at least about 180 degrees of the circumference of said roller.

* * * * *